United States Patent [19]

Mizutani

[11] Patent Number: 4,628,276
[45] Date of Patent: Dec. 9, 1986

[54] LOGARITHMICALLY LINEARLY CONTROLLED VARIABLE GAIN AMPLIFIER

[75] Inventor: Mikio Mizutani, Tokyo, Japan

[73] Assignee: Matsushita Graphic Communications Systems, Inc., Japan

[21] Appl. No.: 682,596

[22] Filed: Dec. 14, 1984

[30] Foreign Application Priority Data

Dec. 15, 1983 [JP] Japan .................................. 58-236695
Aug. 18, 1984 [JP] Japan .................................. 59-171997

[51] Int. Cl.[4] .............................................. H03G 3/20
[52] U.S. Cl. ........................................ 330/86; 330/282
[58] Field of Search ................ 330/86, 144, 145, 151, 330/282, 284

[56] References Cited

U.S. PATENT DOCUMENTS 3,848,091 11/1974 Stearns et al. ...................... 179/1 N
3,902,131 8/1975 Dorren .............................. 330/126

FOREIGN PATENT DOCUMENTS 45230 3/1980 Japan .................................. 330/86
2029142 3/1980 United Kingdom .
2052220 1/1981 United Kingdom .

OTHER PUBLICATIONS

Benedetti, "Keyboard Programs the Gain of an Operational Amplifier", Electronics, vol. 50, No. 26, Dec. 22, 1977, p. 80.
Edrington, "D-A Converter Forms Programmable Gain Control", Electronics, vol. 48, No. 15, Jul. 24, 1975, p. 92.
Metz, "Combination Logic Cuts Parts in Digitally Controlled Amplifier," Electronics, Sep. 18, 1975, pp. 54, 55.

Primary Examiner—James B. Mullins
Attorney, Agent, or Firm—Lowe, Price, LeBlanc, Becker & Shur

[57] ABSTRACT

A variable gain amplifier of the logarithmically linear type comprises a divider for dividing a signal applied to the input terminal of the amplifier by a gain control signal. The output of the divider is applied to a first input of a subtractor, the second input of the subtractor being connected to receive the signal applied to the amplifier's input terminal to deliver a signal to the output terminal of the amplifier. The amplifier has an input-to-output characteristic given by $(2^n/x)-1$ which is approximated to $\exp\{2-x/(2^{n-2})\}$, where x represents the gain control signal.

13 Claims, 3 Drawing Figures

4,628,276

LOGARITHMICALLY LINEARLY CONTROLLED VARIABLE GAIN AMPLIFIER

BACKGROUND OF THE INVENTION

The present invention relates to a variable gain amplifier of the type having a logarithmically linearly controlled amplification gain.

Conventional variable gain amplifiers of the logarithmic linear type comprise a multiplier and an exponential converter which converts a gain control signal to a signal having an exponentially variable characteristic. The multiplier provides multiplication of input signal by the output of an exponential converter. The gain of this type of amplifier is a logarithmically linear function of the gain control signal. However, the exponential converter is complex and expensive. The exponential circuit would be further complicated if the gain control were performed by a digital signal since the circuit would be required to process a larger number bits than the number of bits needed to resolve the gain control range.

SUMMARY OF THE INVENTION

Accordingly, the primary object of the present invention is to provide a logarithmically linearly controlled variable gain amplifier which is simple and and inexpensive.

The present invention is based on the fact that an equation $(2^N/X) - 1$ can be approximated as $\exp\{2 - X/(2^{N-2})\}$, where X is a variable and N represents a positive integer. The present invention contemplates the use of a divider and a subtractor. An analog input signal is applied to the divider and subtractor. The divider responds to a digital gain control signal at a second input thereof to divide the signal at the first input thereof. The subtractor also responds to an output signal of the divider to generate a gain-controlled signal. The amplifier has an input-to-output characteristic given by $(2^n/x) - 1$, where x represents the gain control signal and in the case of digital gain control n represents the wordlength, or number of resolution bits.

BRIEF DESCRIPTION OF THE DRAWINGS

The present invention will be described in further detail with reference to the accompanying drawings, in which.

DETAILED DESCRIPTION

Figure 1:
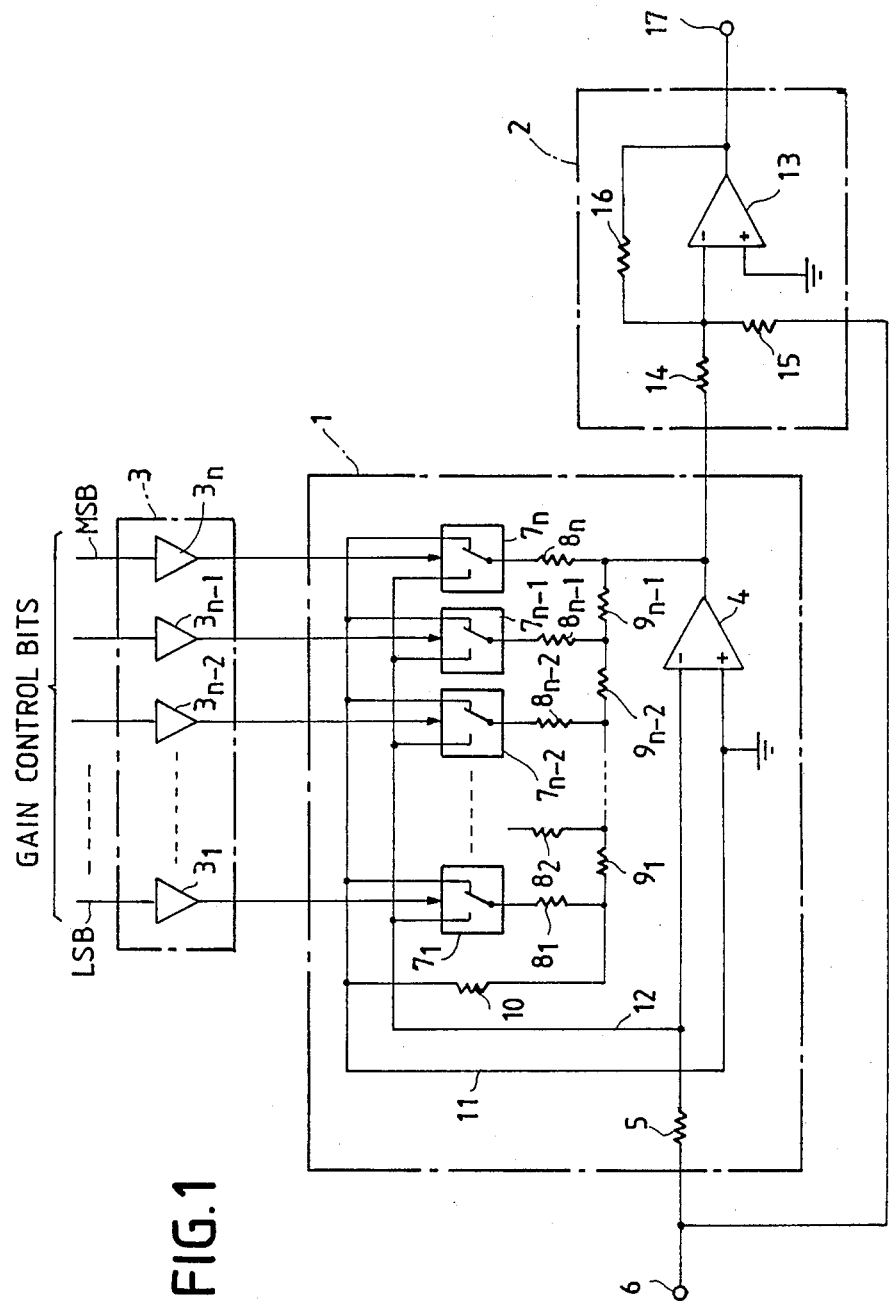
FIG. 1 is a circuit diagram of a variable gain amplifier of the invention.

FIG. 1 is a circuit diagram of a variable gain amplifier constructed in accordance with the present invention. The variable gain amplifier generally comprises a divider 1, a subtractor 2 and a buffer 3. The divider 1 comprises an operational amplifier 4 having an inverting input coupled through a resistor 5 to the input terminal 6 of the variable gain amplifier and a noninverting input coupled to ground. Divider 1 further includes a plurality of analog switches $7_1$ through $7_n$ which are respectively responsive to the outputs of buffer amplifiers $3_1$ through $3_n$ of buffer 3. A plurality of resistors in a ladder network configuration are respectively connected to the output terminals of the analog switches.

Each ladder network comprises a first resistor 8 having a resistance value 2R and a second resistor 9 having a resistance value R. The signals coupled through switches $7_1$ through $7_n$ are respectively coupled to a first end of each of resistors $8_1$ through $8_n$. Resistors $9_1$ through $9_{n-1}$ are connected in series from the second end of resistor $8_1$ to the second end of resistor $8_n$, with taps between successive ones of resistors 9 being connected to the second ends of resistors $8_2$ through $8_{n-1}$, respectively. The junction between resistors $8_1$ and $9_1$ is connected by a resistor 10 having a resistance 2R to a conductor 11 which is grounded, and the junction between resistors $8_n$ and $9_{n-1}$ is connected to the output terminal of operational amplifier 4.

Analog switches $7_1$ through $7_n$ are normally positioned so resistors $8_1$–$8_n$ are connected to ground via the right-side terminals of the terminals and lead switches $7_1$–$7_n$ are switched to the left-side terminals thereof in response to binary signals from the buffer 3. The left-side terminals of switches $7_1$ through $7_n$ are coupled together by lead 12 to the inverting input of operational amplifier 4.

The buffer amplifiers $3_1$ through $3_n$ are arranged in binary positions in the order of increasing significance to receive an n-bit gain-control binary signal so that buffer amplifier $3_1$ receives a least significant bit of the gain control signal and buffer amplifier $3_n$ receives a most significant bit.

To increase amount of gain control, the number of analog switches 7 which are activated by the outputs of associated buffer amplifiers 3 increases, whereby the resistance connected between the inverting input and output terminals of operational amplifier 4 decreases as a function of the number of the activated switches. The amplification gain $A_D$ of the divider 1 is given by the following equation:

$$A_D = -(R_9/R_5)(2^n/x) \quad (1)$$

where, $R_9$ = the resistance of each of resistors $9_1$ to $9_{n-1}$ which equals R;

$R_5$ = the resistance of resistor 5 and equals R; and x = the amount of gain control in a range between 0 and $2^n - 1$.

Equation 1 is rewritten as:

$$A_D = -2^n/x \quad (2)$$

The subtractor 2 comprises an operational amplifier 13 having an inverting input coupled through a resistor 14 to the output of operational amplifier 4 on the one hand and through a resistor 15 to the input terminal 6 on the other hand, with the noninverting input being coupled to ground. The output of operational amplifier 13 is coupled by a feedback resistor 16 to the inverting input.

The total amplification gain $A_T$ of the variable gain amplifier is given by:

$$A_T = V_o/V_i = R_{16}(1/R_{15} + A_D/R_{14}) = R_{16}(1/R_{15} - 2^n/(R_{14} \cdot x)) \quad (3)$$

where, $V_o$ = the output signal of divider 1;

$V_i$ = the input signal at terminal 6; and $R_{14}$, $R_{15}$ and $R_{16}$ = the resistances of resistors 14, 15 and 16, respectively.

Figure 3:
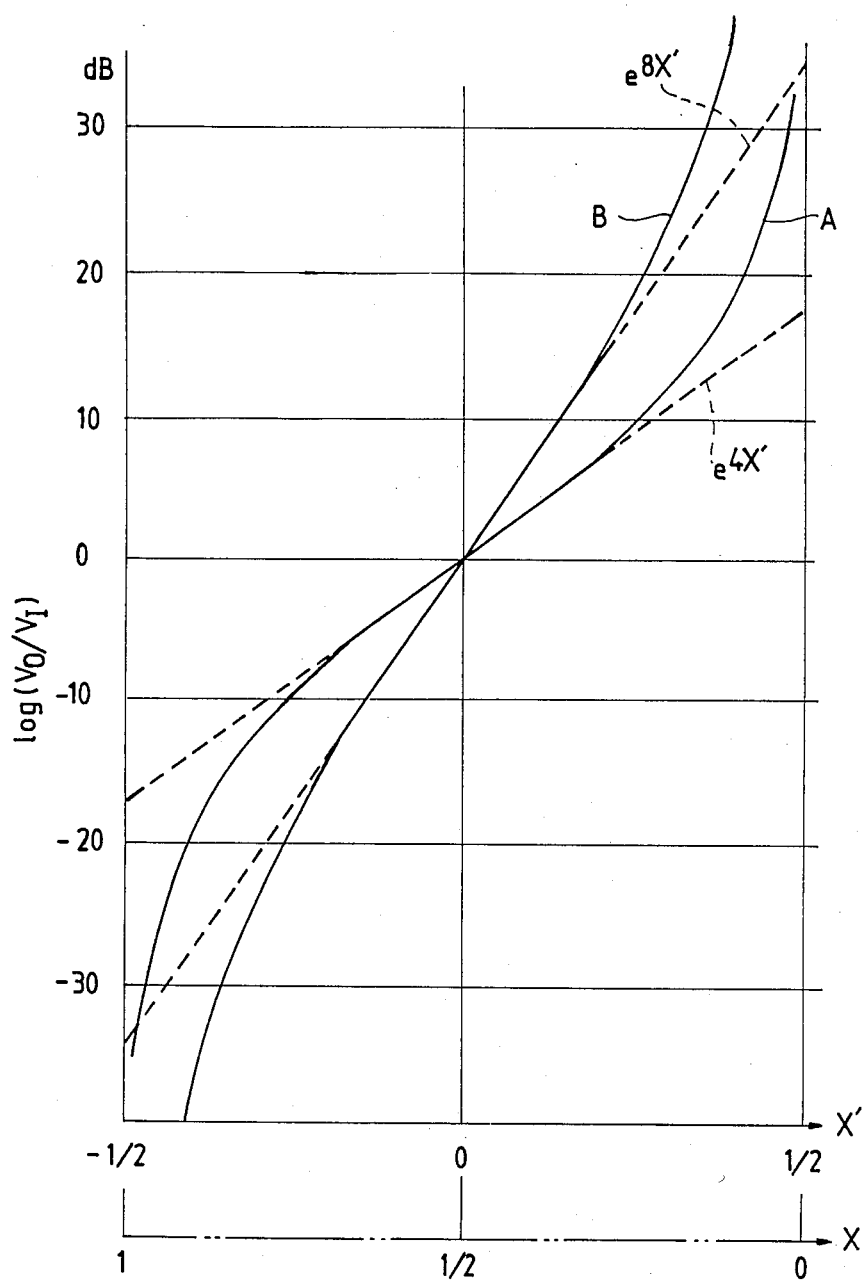
FIG. 3 is a graphic illustration of the operating characteristics of the FIGS. 1 and 2 embodiments.

By using a variable X equal to $x/2^n$ instead of x and assuming that $R_{14}=R_{15}=R_{16}$, Equation 3 can be rewritten as:

$$A_T = (1/X) - 1 \qquad (4)$$

where, X is in the range between 0 and unity. Equation 4 is further written as follows by converting X to X' which equals $(\frac{1}{2})-X$:

$$A_T = \frac{-1}{(1/2) - X'} \qquad (5)$$

where, X' is in the range between $-\frac{1}{2}$ and $\frac{1}{2}$. The Taylor series expansion of Equation 5 indicates that it agrees with a linear equation given by $e^{4X'}$ to the term $X'^2$ of the series. As graphically given by curve A in FIG. 3, the logarithmic value of amplification gain $A_T$ varies linearly as a function of variable X' over a substantial region of the range $\pm \frac{1}{2}$ and varies monotonically out of this region.

Figure 2:
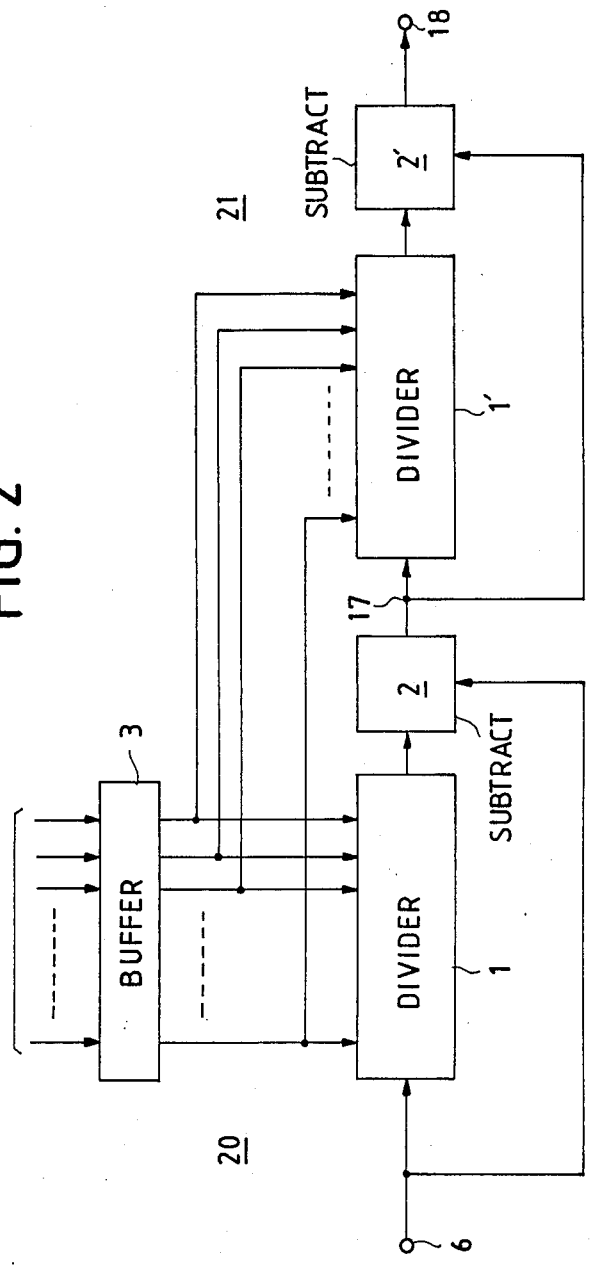
FIG. 2 is a block diagram of a variable gain amplifier circuit according to the invention.

The dynamic range of a variable gain amplifier can be increased by connecting a plurality of variable gain amplifiers of FIG. 1 in a manner as shown in FIG. 2. In this circuit configuration, the output terminal 17 of a first variable gain amplifier 20 is connected to the input of the divider 1' and to a subtractor 2' of a second variable gain amplifier 21. The gain control input terminals of divider 1' are multipled with the corresponding gain control input terminals of divider 1. The total amplifier gain $A_T'$ of FIG. 2 is given as follows:

$$A_{T'} = \left( \frac{1}{(\frac{1}{2}) - X'} - 1 \right)^2 \qquad (6)$$

where, Vo' is the output signal at terminal 18. Equation 6 agrees with $e^{8X'}$ to the term $X'^2$ of the Taylor series and the logarithmic value of the amplification gain $A_{T'}$ is linear as in the case of the single amplifier configuration, as indicated by a curve B, FIG. 3.

What is claimed is:

1. A circut arrangement comprising:
   an input terminal and an output terminal;
   a first variable gain amplifier comprising:
      a first divider means having a first input connected to said input terminal to receive an analog input signal and a second input to which an n-bit digital gain control signal having a gain control value x is applied for dividing said input signal by the control value x; and
      first subtractor means having a first input connected to an output of said first divider means and a second input connected to said input terminal for generating a first analog output signal having a magnitude directly proportional to the product of the analog input signal and the reciprocal of $\{1-(2/x)n-1\}$; and
   a second variable gain amplifier comprising:
      second divider means having a first input connected to respond to said first analog output signal and a second input to which said gain control signal is applied for dividing the first analog output signal by said control value x; and
      second subtractor means having a first input connected to an output of said second divider means and a second input connected to respond to said first analog output signal, said second subtractor means providing to said output terminal a second analog output signal having a magnitude directly proportional to the product of the analog input signal and the reciprocal of $\{(2/x)n-1\}^2$ which approximates a logarithmically linear function of said digital gain control signal.

2. A circuit arrangement as claimed in claim 1, wherein said first divider means comprises:
   a first operational amplifier having an input connected to said input terminal; and
   a first feedback circuit including a first variable resistance means connected from the output of said first operational amplifier and to an input of said first operational amplifier, the first variable resistance means being responsive to said gain control signal to vary the resistance value of the feedback circuit, wherein said second divider means comprises:
   a second operational amplifier having an input connected to the output of said first subtractor means; and
   a second feedback circuit including a second variable resistance means connected from the output of said second operational amplifier and to an input of said second operational amplifier, the second variable resistance means being responsive to said gain control signal to vary the resistance value of the second feedback circuit.

3. A circuit arrangement as claimed in claim 2, wherein said first resistance means comprises a first ladder network having a series of first resistors connected from the output of the first operational amplifier and a plurality of second resistors, each of said second resistors having a first end and a second end, the first end of each of said second resistors being connected respectively to said first resistors, a like plurality of first switches selectively connecting the second ends of said second resistors to the input of said first operational amplifier in response to binary signals representing said gain control signal, wherein said second resistance means comprises a second ladder network having a series of third resistors connected from the output of said second operational amplifier and a plurality of fourth resistors, each of said fourth resistors having a first end and a second end, the first end of each of said fourth resistors being connected respectively to said third resistors, wherein the resistance value of each of said second resistors is twice as high as the resistance value of each of said first resistors and wherein the resistance value of each of said fourth resistors is twice as high as the resistance value of each of said third resistors, a like plurality of second switches selectively connecting the second ends of said fourth resistors to the input of said second operational amplifier in response to said binary signals.

4. A circuit arrangement as claimed in claim 3, wherein said first subtractor means comprises:
   a third operational amplifier having a first input connected to the output of the first operational amplifier and a second input connected to said input terminal; and
   a third feedback circuit including a resistor connected from the output of said third operational amplifier to the first input thereof, and wherein said second subtractor means comprises:
   a fourth operational amplifier having a first input connected to the output of the second operational amplifier and a third input connected to the output of said second operational amplifier, said fourth operational amplifier providing an output signal to said output terminal; and a fourth feedback circuit including a resistor connected from the output of said fourth operational amplifier to the first input thereof.

5. A circuit for deriving an analog output signal having a magnitude that is approximately logarithmically linearly proportional to an analog input signal, comprising a multi-bit digital signal source for controlling a logarithmic linear proportional factor, the factor having a magnitude x, the number of bits of said digital signal being n, the magnitude being in a range between 0 and $2^n-1$, M cascaded networks, where M is an integer greater than one, each of said networks having a transfer function represented by $(2^n/x-1)$ which is approximately directly proportional to $\exp\{2-x/2^{n-1}\}$ whereby each of said networks derives an additional analog signal having a magnitude directly proportional to the product of the magnitude of an input analog signal thereof and $(2^n/x-1)$, the first of said networks being responsive to the analog input signal whereby the Mth one of said networks derives an analog output signal directly proportional to the product of said analog input signal and $(2^n/x-1)^M$, each of said networks including a variable gain circuit having an analog input signal terminal, the analog input signal terminal of the variable gain circuit of the first network being responsive to the analog input signal, the analog input signal terminal of the variable gain circuit of network k being responsive to the additional signal derived by network $(k-1)$, where k is selectively every integer from 2 to M, said circuit of network k including: n switches selectively in first and second states, n impedances coupled to the switches so that the magnitude of the impedance effectively in the variable gain circuit is varied by which of the switches are in the first and second states, means responsive to the magnitude of the multi-bit digital signal for controlling which of said switches are in the first and second states, the variable gain circuit of network k deriving a further analog signal, means linearly combining the further analog signal of the circuit of network k and the signal at said input terminal of the circuit of network k for deriving the additional analog signal of network k, the additional analog signal of network M having a magnitude approximately directly proportional to the product of the magnitude of the analog input signal and $\exp M\{2-x/2^{n-1}\}$ to form the analog output signal having a magnitude that is approximately logarithmically linearly proportional to the analog input signal.

6. The circuit of claim 5 wherein each variable gain circuit includes an operational amplifier having input and output terminals, a variable negative feedback impedance circuit connected between the amplifier input and output terminals, an input impedance circuit and a variable shunt output impedance circuit connected between the amplifier output terminal and a reference potential terminal, the n impedances being selectively included by said n switches in said input and output impedance circuits, and being coupled to said amplifier to control the magnitudes of said variable impedance circuits in response to changes in the first and second states of said n switches.

7. The circuit of claim 6 wherein said n impedances and n switches are connected to said feedback and output shunt circuits to form a ladder circuit having: $(n-1)$ first impedances connected in a series string with a second impedance between the output terminal of said amplifier and the reference potential terminal, said second impedance having first and second end terminals respectively connected to said reference potential terminal and a terminal of one of said first impedances, a tap between adjacent ones of said first impedances, n third impedances, one of said third impedances having one terminal connected directly to the output terminal of said amplifier, each of $(n-2)$ of said other third impedances having one terminal connected directly to said taps, the remaining third impedance having one terminal connected directly to the second terminal of the second impedance, each of said third impedances having a second terminal connected to one of said switches so that when switch j is in the first and second states the second terminal of third impedance j is respectively connected to the reference potential and to the input terminal of said amplifier, where j is selectively every integer from 1 to n.

8. The circuit of claim 7 wherein the input impedance circuit and each of the first impedances has a value of R, and each of the third impedances and the second impedance has a value of 2R.

9. A variable gain amplifier comprising:
an input terminal and an output terminal;
divider means having a first input connected to said input terminal to receive an analog input signal and a second input to which an n-bit digital gain control signal having a gain control value x is applied for dividing said analog input signal by the control value x;
subtractor means having a first input connected to an output of said divider means and a second input connected to said input terminal, the subtractor means providing to said output terminal an analog output signal, whereby the ratio of the analog input signal to the analog output signal is $(2^n/x)-1$ which approximates a logarithmically linear function of said control signal, said divider means comprising:
an operational amplifier having an input connected to said input terminal; and
a feedback circuit including a variable resistance means connected from the output of said operational amplifier to an input of said operational amplifier, the variable resistance means being responsive to said gain control signal to vary the resistance value of the feedback circuit; said resistance means comprising a ladder network having a series of first resistors connected from the output of the amplifier and a plurality of second resistors, each of said second resistors having a first end and a second end, the first end of each of said second resistors being connected respectively to said first resistors, a like plurality of switches selectively connecting the second ends of said second resistors to the input of said operational amplifier in response to binary signals representing said gain control signal, wherein the resistance value of each of said second resistors is twice as high as the resistance value of each of said first resistors.

10. A variable gain amplifier as claimed in claim 9, wherein said subtractor means comprises:
a second operational amplifier having a first input connected to the output of the first-mentioned operational amplifier and a second input connected to said input terminal; and a feedback circuit including a resistor connected from the output of said second operational amplifier to the first input thereof.

11. A circuit for deriving an analog output signal having a magnitude that is approximately logarithmically linearly proportional to an analog input signal, comprising a multi-bit digital signal source for controlling a logarithmic linear proportional factor, the factor having a magnitude x, the number of bits of said digital signal being n, where n is an integer greater than 1, the magnitude being in a range between 0 and $2^n-1$, a variable gain circuit having n switches selectively in first and second states, n impedances coupled to the switches so that the magnitude of the impedance effectively in the variable gain circuit is varied by which of the switches are in the first and second states, means responsive to the magnitude of the multi-bit digital signal for controlling which of said switches are in the first and second states, said circuit having a transfer function directly proportional to $2^n/x$ and being responsive to the analog input signal so that the circuit derives an additional analog signal directly proportional to the product of the magnitude of the analog input signal and $2^n/x$, means linearly combining the additional analog signal and the analog input signal for deriving a further analog signal having a magnitude directly proportional to the product of the analog input signal and $(2^n/x-1)$, the further analog signal being approximately directly proportional to the product of the analog input signal and $\exp\{2-x/2^{n-1}\}$ to form the analog output signal having a magnitude that is approximately logarithmically linearly proportional to the analog input signal, the variable gain circuit including an operational amplifier having input and output terminals, a variable negative feedback impedance circuit connected between the amplifier input and output terminals, an input impedance circuit and a variable shunt output impedance circuit connected between the amplifier output terminal and a reference potential terminal, the n impedances being selectively included by said n switches in said input and output impedance circuits, and being coupled to said amplifier to control the magnitudes of said variable impedance circuits in response to changes in the first and second states of said n switches.

12. The circuit of claim 11 wherein said n impedances and n switches are connected to said feedback and output shunt circuits to form a ladder circuit having: $(n-1)$ first impedances connected in a series string with a second impedance between the output terminal of said amplifier and the reference potential terminal, said second impedance having first and second end terminals respectively connected to said reference potential terminal and a terminal of one of said first impedances, a tap between adjacent ones of said first impedances, n third impedances, one of said third impedances having one terminal connected directly to the output terminal of said amplifier, each of $(n-2)$ of said other third impedances having one terminal connected directly to said taps, the remaining third impedance having one terminal connected directly to the second terminal of the second impedance, each of said third impedances having a second terminal connected to one of said switches so that when switch j is in the first and second states the second terminal of third impedance j is respectively connected to the reference potential and to the input terminal of said amplifier, where j is selectively every integer from 1 to n.

13. The circuit of claim 12 wherein the input impedance circuit and each of the first impedances has a value of R, and each of the third impedances and the second impedance has a value of 2R.

* * * * *